United States Patent
Mayuzumi

(10) Patent No.: US 6,833,670 B2
(45) Date of Patent: Dec. 21, 2004

(54) ORGANIC EL DISPLAY AND METHOD FOR MANUFACTURING ORGANIC EL DISPLAY

(75) Inventor: Yohei Mayuzumi, Tokyo (JP)

(73) Assignee: Nagase & Co., Ltd. (JP)

( * ) Notice: Subject to any disclaimer, the term of this patent is extended or adjusted under 35 U.S.C. 154(b) by 117 days.

(21) Appl. No.: 10/031,781

(22) PCT Filed: May 23, 2001

(86) PCT No.: PCT/JP01/04325

§ 371 (c)(1),
(2), (4) Date: Jan. 23, 2002

(87) PCT Pub. No.: WO01/91520

PCT Pub. Date: Nov. 29, 2001

(65) Prior Publication Data

US 2003/0006698 A1 Jan. 9, 2003

(30) Foreign Application Priority Data

May 23, 2000 (JP) ...................... P2000-151728

(51) Int. Cl.⁷ ............................. H01J 1/62; H01J 63/04
(52) U.S. Cl. ...................................................... 313/506
(58) Field of Search ................................ 313/506, 505, 313/500; 445/24

(56) References Cited

U.S. PATENT DOCUMENTS

| | | | |
|---|---|---|---|
| 4,357,557 A | 11/1982 | Inohara et al. | 313/509 |
| 6,120,338 A * | 9/2000 | Hirano et al. | 445/24 |
| 6,236,416 B1 * | 5/2001 | Kuribayashi et al. | 347/118 |

FOREIGN PATENT DOCUMENTS

| | | | |
|---|---|---|---|
| JP | 4-116619 | 4/1992 | G02F/1/13 |
| JP | 5-249422 | 9/1993 | G02F/1/13 |
| JP | 5-249423 | 9/1993 | G02F/1/13 |
| JP | 6-310273 | 11/1994 | H05B/33/10 |
| JP | 8-302340 | 11/1996 | C09K/11/06 |
| JP | 11-45780 | 2/1999 | H05B/33/26 |
| JP | 11-138899 | 5/1999 | B41J/2/44 |
| JP | 11-339954 | 12/1999 | H05B/33/04 |
| JP | 2000-40586 | 2/2000 | H05B/33/04 |
| JP | 2001-68265 | 3/2001 | H05B/33/04 |

OTHER PUBLICATIONS

Patent Abstracts of Japan, Publication No. 04–116619 dated Apr. 17, 1992, 1 page.
Patent Abstracts of Japan, Publication No. 05–249422 dated Sep. 28, 1993, 1 page.
Patent Abstracts of Japan, Publication No. 05–249423 dated Sep. 28, 1993, 1 page.

(List continued on next page.)

*Primary Examiner*—Vip Patel
*Assistant Examiner*—Sumati Krishnan
(74) *Attorney, Agent, or Firm*—Osha & May L.L.P.

(57) ABSTRACT

An organic EL display comprises a first translucent substrate 1; an organic EL element 2, provided on top of the first translucent substrate 1, and formed by layering an anode, a photoemissive layer formed from a plurality of organic substances, and a cathode; and a second translucent substrate 31 which seals the organic EL element 2. The second translucent substrate 31 adopts a configuration comprising a depression 30 at the site facing the organic EL element 2.

3 Claims, 2 Drawing Sheets

OTHER PUBLICATIONS

Patent Abstracts of Japan, Publication No. 2000–040586 dated Feb. 8, 2000, 2 pages.
Patent Abstracts of Japan, Publication No. 11–339954 dated Dec. 10, 1999, 2 pages.
Patent Abstracts of Japan, Publication No. 08–302340 dated Nov. 19, 1996, 2 pages.
Patent Abstracts of Japan, Publication No. 06–310273 dated Nov. 4, 1994, 2 pages.
Patent Abstracts of Japan, Publication No. 11–138899 dated May 25, 1999, 2 pages.
Patent Abstracts of Japan, Publication No. 11–045780 dated Feb. 16, 1999, 1 page.
Patent Abstract of Japan, Publication No. 2001–068265 dated Mar. 16, 2001.
Taiwanese Patent Application No. 090112554 Office Action dated Mar. 8, 2004 (4 pgs.).

* cited by examiner

ORGANIC EL DISPLAY AND METHOD FOR MANUFACTURING ORGANIC EL DISPLAY

TECHNICAL FIELD

This invention relates to an organic electroluminescent display (hereafter "organic EL display") in which the organic light-emission element is protected from water vapor and similar and provided with an extended lifetime, and a method of manufacture of an organic EL display.

BACKGROUND ART

In recent years, organic EL displays have attracted attention as flat panel displays. Organic EL displays can be driven by a DC voltage, so that the driving circuitry can be simplified, and there is no viewing-angle dependence like that of liquid crystal displays; and they have the further feature of high brightness by virtue of self-emissive operation. And, they have the further feature of a quite fast response time compared with liquid crystal displays.

Conventional organic EL displays are explained referring to FIG. 1. FIG. 1 is a cross-sectional view of a conventional organic EL display. An organic EL element 2, formed by layering of a cathode 2a with a photo-emissive layer 2b formed from a plurality of organic substances 2b1, 2b2, 2b3 and an anode 2c, is provided on the glass substrate 1. For simplicity of narrative, references for the above-mentioned layers of the organic EL element are omitted from the following description, and, hence, the organic EL element 2 is only referenced as a whole. The organic EL element 2 is easily affected by water vapor, and the lifetime is shortened when there is a large amount of water vapor present; hence the organic EL element 2 must be shielded from water vapor. To this end, a metal cap 3 is provided which seals the organic EL element 2 and shields the element 2 from water vapor. The metal cap 3 is bonded with adhesive 4 to the glass substrate 1. A desiccating agent 5 which absorbs water vapor is provided on the surface inside the metal cap 3 opposing the organic EL element 2.

Next, a method of manufacture of a conventional organic EL display configured in this way is explained. First, an organic EL element 2 is formed by layering an anode, organic film and cathode, not shown, by evaporation deposition onto large-size (for example, 300 mm×400 mm) transparent-electrode glass as the glass substrate 1 in a nitrogen environment, so as to prevent the intrusion of water vapor. At this time, a plurality of organic EL elements 2 are formed in regular fashion on the transparent-electrode glass. Next, a metal cap 3 is formed from a metal (for example, SUS steel or Al), and BaO is bonded to the interior as a desiccating agent 5. Each of the organic EL elements 2 provided on the transparent-electrode glass is covered by such a metal cap 3, which is bonded to the transparent-electrode glass with adhesive 4. Finally, the transparent-electrode glass is divided into separate organic EL elements 2. In this division, a scriber or similar may be used. By this means, organic EL displays are manufactured.

DISCLOSURE OF THE INVENTION

In a conventional organic EL display, one metal cap 3 is provided for each of the plurality of organic EL elements provided on the transparent-electrode glass, entailing difficulties and impeding improvement of productivity. Further, due to the high temperature of the surrounding environment, organic EL displays may be affected by heat. Also, heat generated during optical emission may have consequences. That is, because the materials of the glass substrate 1 and of the metal cap 3 are different, thermal expansion coefficients will differ. Hence heat induces thermal expansion of different magnitudes in the glass substrate 1 and in the metal cap 3, so that stress occurs in bonding portions. As a result, water vapor may penetrate into the metal cap 3 from the bonded portion using the adhesive 4, giving rise to the problem of a shortened lifetime for the organic EL display. Moreover, because the metal cap 3 is not translucent, light emitted by the organic EL element is absorbed, further promoting increases in temperature of the organic EL display.

The present invention was devised in light of these circumstances, and has as an object the provision of an organic EL display, and a method of manufacture of an organic EL display, enabling improved durability and improved productivity.

In order to achieve the above object, the organic EL display of this invention is an organic EL display comprising a first translucent substrate; an organic EL element, provided on the first translucent substrate, and formed by layering of an anode, a photoemissive layer formed from a plurality of organic substances, and a cathode; and a second translucent substrate which seals the organic EL element; and characterized in that the second translucent substrate comprises a depression at the location opposing the organic EL element.

Thus in order to seal the organic EL element, the second translucent substrate, of the same material as the first translucent substrate on which the organic EL element is provided, is used. As a result, the thermal expansion coefficients of the first translucent substrate and the second translucent substrate are the same, so that even if the first translucent substrate and second translucent substrate expand due to heat in the neighboring environment or to heat generated during light emission, they expand in the same way. Consequently no stress occurs at the bonding portion, and the degree of sealing of the organic EL element can always be maintained at a high level. As a result, intrusion of water vapor can be prevented, so that the durability of the organic EL display can be improved.

Further, a second translucent substrate is used as the means of sealing the organic EL element, so that light emitted by the organic EL element is transmitted from the second translucent substrate. Because of this, it is possible to avoid heat generation due to absorption of light emitted from the organic EL element by the sealing means, as for example in cases where the organic EL element is sealed using a substance which is not translucent, such as a conventional metal cap Consequently increases in the temperature of the organic EL display caused by light emission can be prevented.

Further, a plurality of organic EL elements can be formed on the first translucent substrate, depressions formed in the second translucent substrate at sites corresponding to each organic EL element by, for example, chemical etching or mechanical etching, the first and second translucent substrates bonded such that organic EL elements and depressions oppose each other, and the bonded first and second translucent substrates divided into individual organic EL elements.

Consequently numerous organic EL displays can be manufactured at once, and productivity can be improved.

BEST MODES FOR CARRYING OUT THE INVENTION

Figure 1:
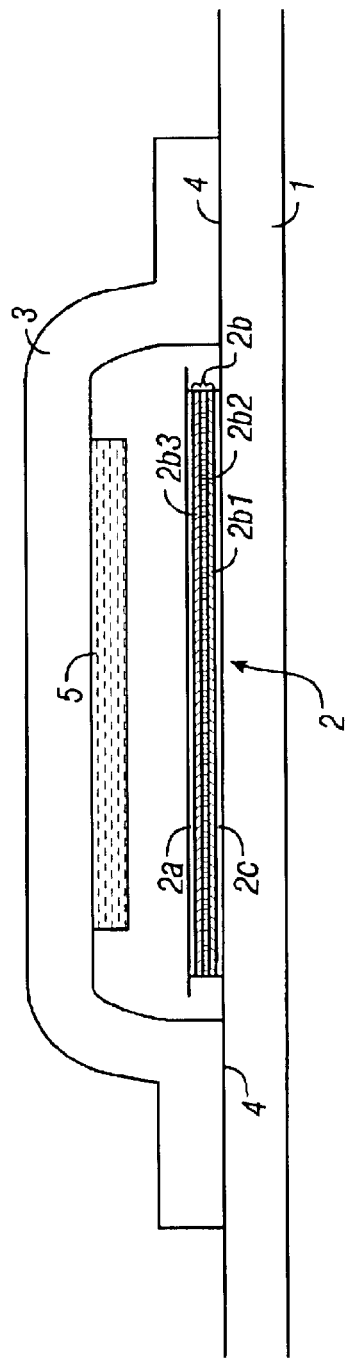
FIG. 1 is a cross-sectional view of a conventional organic EL display.

The authors focused on the fact that if a metal cap is provided for each of a plurality of organic EL elements on transparent-electrode glass, difficulties result and improvement of productivity is impeded, and on the fact that if the substrate on which the organic EL element is formed and the sealing means to seal the organic EL element are formed of different material, the thermal expansion coefficients will be different, so that heat from the surrounding environment or heat generated during light emission will cause thermal expansion of different magnitudes in the substrate and in the sealing means, resulting in the occurrence of stress, and a decline in the degree of sealing. It was discovered that by forming the sealing means from the same material as the substrate on which the organic EL element is formed, numerous organic EL displays can be manufactured at once, and a high degree of sealing between the substrate and the sealing means can be maintained, resulting in the present invention.

That is, the present invention is an organic EL display comprising a first translucent substrate; an organic EL element, provided on the first translucent substrate, and formed by layering of an anode, a photoemissive layer formed from a plurality of organic substances, and a cathode; and a second translucent substrate which seals the organic EL element; and is characterized in that the second translucent substrate comprises a depression at the location opposing the organic EL element.

By this means, this invention enables improvement of productivity, and enables maintenance of the degree of sealing of the organic EL element at a high level, to improve the durability of the organic EL display.

Below, aspects of this invention are explained, referring to the drawings. The same components in the drawings are assigned the same symbols, and redundant explanations are omitted. Dimensional ratios in the drawings may not be in agreement with those in explanations.

First Aspect

Figure 2:
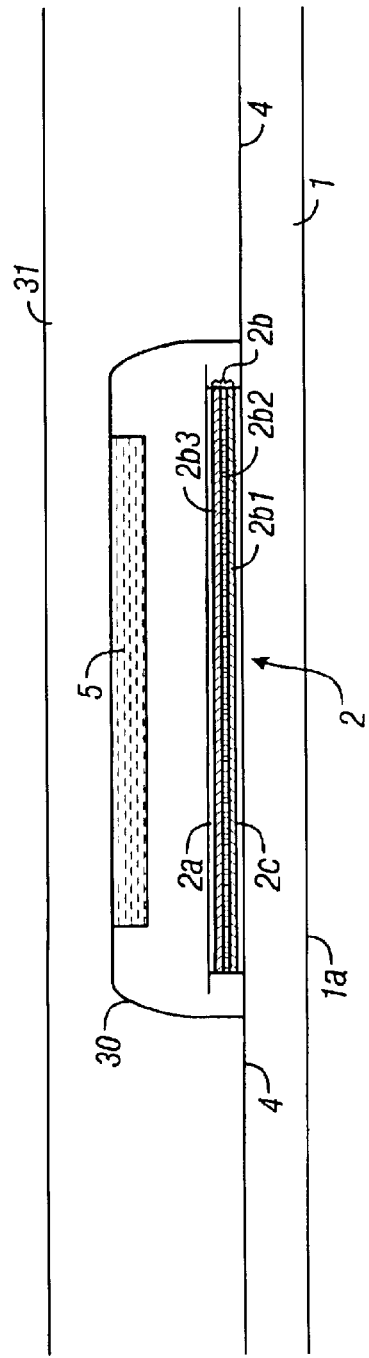
FIG. 2 is a cross-sectional view of the organic EL display of a first aspect of the invention.

FIG. 2 is a cross-sectional view of the organic EL display of a first aspect of this invention. On the glass substrate 1 as the translucent substrate there is provided an organic EL element 2, formed by layering an anode, a photoemissive layer formed from a plurality of organic substances, and a cathode. The organic EL element 2 is easily affected by water vapor, suffering a shortened lifetime if a large amount of water vapor is present, and therefore must be shielded from water vapor. To this end, in order to seal the organic EL element 2 and shield it from water vapor, a glass substrate 31, in which is formed a depression 30, is provided The depression 30 is formed in the glass substrate 31 by for example chemical etching or mechanical etching at the site corresponding to the organic EL element 2 provided on the glass substrate 1. The glass substrate 31 is bonded to the glass susbtrate 1 using adhesive 4. On the surface on the interior of the depression 30, opposing the organic EL element 2, a desiccating agent 5 which absorbs water vapor is provided. This desiccating agent 5 is not absolutely necessary; but because it is difficult to completely eliminate the possibility of the existence of even a minute amount of water vapor, it is provided for further protection.

In this way, the glass substrate 1 and glass substrate 31 are formed from the same material, so that the thermal expansion coefficients of the glass substrate 1 and the glass substrate 31 are the same. Consequently even if there is expansion of the glass substrate 1 and the glass substrate 31 due to heat from the surrounding environment or heat generated during light emission, the two expand in the same way, so that no stresses occur in the bonded portion, and a high degree of sealing of the organic EL element 2 can be maintained. As a result, intrusion of water vapor can be prevented, and the durability of the organic EL display can be improved.

In order to display images on this organic EL display, a DC voltage is applied to areas from which light is to be emitted. Electrons are then injected into the organic EL element 2 at places where a DC voltage is applied and an electric field appears. As a result, the organic EL element 2 emits light, and a color image is displayed on the display surface 1a.

In the first aspect, a glass substrate 31 is used to seal the organic EL element, so that light emitted by the organic EL element also is transmitted through the glass substrate 31. Consequently it is possible to avoid generation of heat due to absorption of light emitted from the organic EL element 2 by the sealing means, such as occurs in cases where the organic EL element is sealed with a material that is not translucent, as in the case of a conventional metal cap. Hence increases in the temperature of the organic EL display due to light emission can be effectively prevented.

Next, a method of manufacture of the organic EL display of the first aspect, configured as described above, is explained. Evaporation deposition is used to layer an anode, an organic film, and a cathode on large-size (for example, 300 mm×400 mm) transparent-electrode glass as the glass substrate 1, to form the organic EL element 2; this is performed in a nitrogen atmosphere, to prevent the intrusion of water vapor. At this time, a plurality of organic EL elements 2 are formed in regular fashion on the transparent-electrode glass. Next, depressions 30 are formed by, for example, chemical etching (with hydrofluoric acid) or mechanical etching in another large-size glass, at sites corresponding to those of the organic EL elements. Here an example is explained in which chemical etching is used to form the depressions 30.

In the case of chemical etching, an etching liquid consisting mainly of hydrofluoric acid is used A chemical-resistant film or similar is used to mask the areas, on the large-size glass sheet not provided with the above organic EL elements, which surround the sites corresponding to the plurality of organic EL elements. Next, when the masked large-size glass sheet is immersed in the etching liquid, the unmasked sites are etched, and the thickness at these sites is reduced. The time duration of this etching should be set to correspond to the final thickness of the depressions 30 to be obtained. When performing such chemical etching, no large mechanical forces are applied to the large-size glass sheet, so the large-size glass sheet is not damaged. Because etching of the large-size glass sheet proceeds at all the sites for etching, each of the etched sites can be reduced in thickness uniformly. After formation by etching of the depressions 30, BaO is bonded to the inside of the depressions 30 as a desiccating agent 5. Then, the large-size glass sheet on which organic EL elements 2 are provided is laminated using an adhesive 4 with the large-size glass sheet on which depressions 30 are provided. At this time, the two are laminated such that the organic EL elements 2 oppose the depressions 30. By this means, an aggregation of organic EL elements is formed.

The adhesive 4 is selected appropriately by a person skilled in the art from among adhesives capable of bonding the substrates together. For example, a UV-hardening acrylic adhesive is preferred.

The anode of the organic EL element 2 may be formed from ITO (indium tin oxide), for example, or an anode may be provided in advance on the glass substrate 1, and the organic EL element 2 formed.

Figure 3:
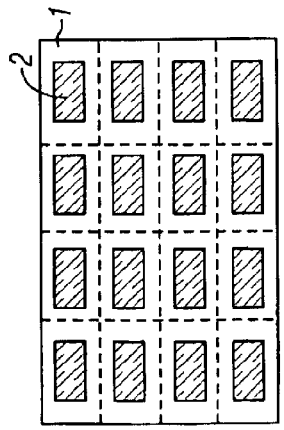
FIG. 3 is a plane view of an aggregation of organic EL elements, formed by laminating two large-size glass sheets.

FIG. 3 is a plane view of an organic EL element aggregation, formed by laminating two large-size glass sheets. In FIG. 3, four organic EL elements 2 are provided [in each column] in the vertical direction, and four organic EL elements 2 are provided [in each row] in the horizontal direction, arranged regularly. The surface of the organic EL element aggregation may also be etched by chemical etching like that described above. By performing etching, thin and lightweight organic EL displays can be obtained. The time during which this etching is performed should be set according to the ultimate thickness of the organic EL display to be obtained. When performing etching, a chemical-resistant film or similar may be used to mask one end face of the organic EL display aggregation before etching; or, both faces may be etched without masking.

This may be selected according to the form of the organic EL display which is ultimately to be obtained.

Finally, the organic EL display aggregation as described above is divided using a scriber or similar into separate organic EL elements 2. Because glass is readily processed, numerous organic EL displays can be manufactured at once in this way, so that productivity can be improved. Also, the thickness of sites which are masked during etching is greater than the thickness of sites not masked; consequently the strength is increased when cutting into masked sites.

Thus in the first aspect of this invention, in order to seal the organic EL element 2, a glass substrate 31 of the same material as the glass substrate 1 on which are provided the organic EL elements 2 is used. As a result, the thermal expansion coefficients of the glass substrate 1 and of the glass substrate 31 are the same, so that even when the glass substrate 1 and glass substrate 31 expand due to heat from the surrounding environment or to heat generated during light emission, the two expand in the same manner. Hence there is no appearance of stress in the bonding portion, and the degree of sealing of the organic EL element can always be maintained at a high level. As a result, intrusion of water vapor can be prevented, so that the durability of the organic EL display can be improved.

Further, a glass substrate 31 is used as the means of sealing the organic EL element 2, so that light emitted by the organic EL element 2 is transmitted from the glass substrate 31. Because of this, it is possible to avoid heat generation due to absorption of light emitted from the organic EL element 2 by the sealing means, as for example in cases where the organic EL element 2 is sealed using a substance which is not translucent, such as a conventional metal cap; hence increases in the temperature of the organic EL display caused by light emission can be prevented. Also, an organic EL element aggregation can be formed, and the organic EL element aggregation can be divided into individual organic EL elements. Hence numerous organic EL displays can be manufactured at once, and productivity can be improved.

Second Aspect

Figure 4:
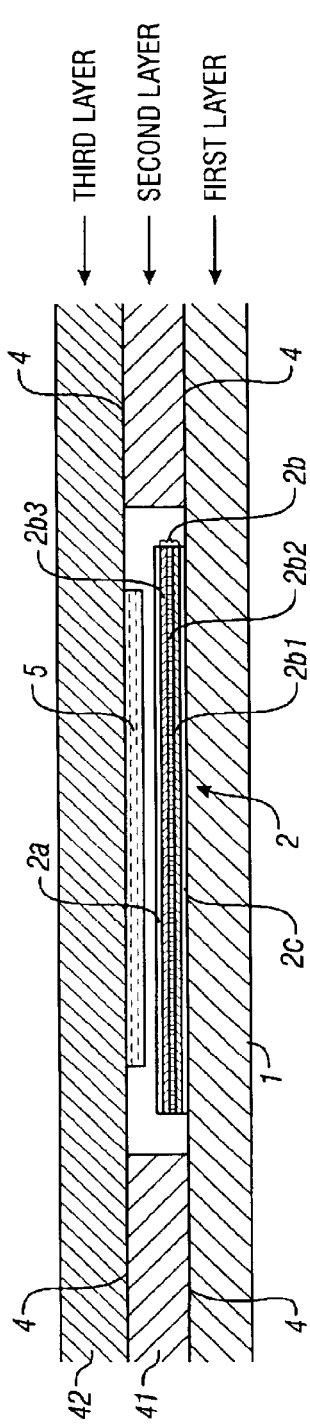
FIG. 4 is a cross-sectional view of the organic EL display of a second aspect of the invention.
Figure 6:
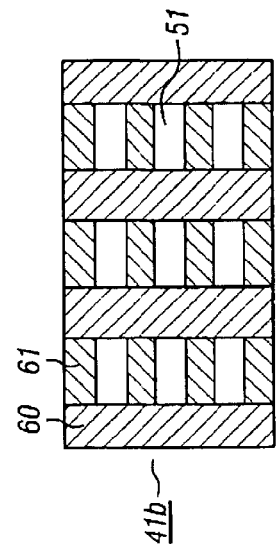
Figure 5:
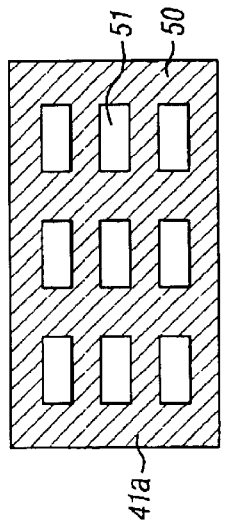
FIG. 5 is a plane view of a glass sheet 41a as a third translucent substrate in the second aspect; and, FIG. 6 is a plane view of a glass sheet 41b as a third translucent substrate in the second aspect.

FIG. 4 is a cross-sectional view of the organic EL display of a second aspect of the invention; FIG. 5 is a plane view of a glass sheet 41a as a third translucent substrate. FIG. 6 is a plane view of a glass sheet 41b as a third translucent substrate.

The organic EL display of the second aspect is, as in the first aspect, provided with an organic EL element 2 on the glass substrate 1. A glass substrate 41, serving as a third translucent substrate and having apertures to accommodate the organic EL elements 2, is bonded on top of the glass substrate 1 using adhesive 4. The glass substrate 42, serving as a fourth translucent substrate formed in a sheet shape, is bonded on top of the glass substrate 41 using adhesive 4. Thus in this aspect, a three-layer structure is formed from the glass substrate 1, the glass substrate 41, and the glass substrate 43. Similarly to the first aspect, a desiccating agent 5 is provided on the surface of the glass substrate 42 opposing the organic EL element 2. As the glass substrate 41, a glass substrate 41a, prepared by forming a plurality of apertures 51 by for example punching in a single glass sheet 50, can be used, as shown in FIG. 5. Also, a glass substrate 41b prepared by combining rectangular glass sheets 60, 61 in a lattice shape to form apertures 51 can be used, as shown in FIG. 6.

In this way, a third translucent substrate in which are formed apertures to accommodate organic EL elements, and a fourth translucent substrate provided on top of the third translucent substrate, are layered on top of a first translucent substrate provided with organic EL elements, so that by bonding the layered first, third, and fourth translucent substrates, the organic EL elements can be sealed without performing an etching or process to form depressions in order to form depressions. Through this, manufacturing efficiency can be improved.

Next, a method of manufacture of the organic EL display of the second aspect, configured as described above, is explained. Evaporation deposition is used to layer an anode, an organic film, and a cathode on large-size (for example, 300 mm×400 mm) transparent-electrode glass as the glass substrate 1, to form the organic EL element 2; this is performed in a nitrogen atmosphere, to prevent the intrusion of water vapor. At this time, a plurality of organic EL elements 2 are formed in regular fashion on the transparent-electrode glass.

Next, a glass substrate 41a or 41b, in which are formed apertures 51, is bonded to the glass substrate 1. Here the organic EL elements 2 and apertures 51 are made to correspond such that each organic EL element 2 is accommodated by an aperture 51. Then, a desiccating agent 5 is bonded onto the surface of the glass substrate 42, formed in sheet shape, opposing the organic EL elements 2, and the glass substrate 42 is then bonded onto the glass substrate 41a or 41b. By this means, an organic EL element aggregation is formed.

The organic EL element aggregation may also be etched using chemical etching. By performing etching, a thin and light organic EL display is obtained. When performing etching, a chemical-resistant film or similar may be used to mask one end face of the organic EL display aggregation before etching, or both end faces may be etched, without masking. These [options] should be selected according to the form of organic EL display which is ultimately to be obtained. In chemical etching, an etching liquid consisting mainly of hydrofluoric acid is used. When an organic EL display aggregation is immersed in the above etching liquid, it masking is performed, the unmasked sites are etched, and the thickness of other sites is reduced. If masking is not performed, the thickness is reduced uniformly across the entire surface. The time duration of the etching should be set according to the thickness of the organic EL display which is ultimately to be obtained.

When performing such chemical etching, the organic EL display aggregation is not subjected to mechanical forces, so that there is no damage to the organic EL display aggregation. Also, because etching proceeds at all sites to be etched, each of the etched sites can be reduced in thickness uniformly. By this means, a thin and lightweight organic EL display can be obtained.

Finally, the organic EL display aggregation is divided using a scriber or similar into separate organic EL elements 2. Because glass is readily processed, numerous organic EL displays can be manufactured at once in this way, so that productivity can be improved. Also, the thickness of sites which do not have apertures 51 is greater than the thickness of sites which do have apertures 51; consequently the supporting strength is increased when performing cutting at sites not having apertures 51.

Thus in the organic EL display of the second aspect, a glass substrate 41 in which are formed apertures 51 to accommodate organic EL elements 2 and a glass substrate 42 provided on the glass substrate 41 are layered on top of a glass substrate 1 on which are provided organic EL elements, so that by bonding the glass substrates 1, 41 and 42, the organic EL elements can be. sealed without an etching or other process to form depressions. As a result, manufacturing efficiency can be improved.

BEST MODES FOR CARRYING OUT THE INVENTION

As is clear from the above explanation, in this invention a second translucent substrate; formed of the same material as a first translucent substrate on which is provided the organic EL element, is used to seal the organic EL element. As a result, the thermal expansion coefficients of the first translucent substrate and of the second translucent substrate are the same, so that even if the first translucent substrate and second translucent substrate expand due to heat from the surrounding environment or to heat generated during light emission, both expand in the same manner. Hence there is no occurrence of stress in the bonded portion, and a high degree of sealing of the organic EL element can be maintained. As a result, intrusion of water vapor can be prevented, and the durability of the organic EL display can be improved.

Further, a second translucent substrate is used as the means of sealing the organic EL element, so that light emitted by the organic EL element is transmitted through the second translucent substrate. Because of this, it is possible to avoid heat generation due to absorption of light emitted from the organic EL element by the sealing means, as for example in cases where the organic EL element is sealed using a substance which is not translucent, such as a conventional metal cap; hence increases in the temperature of the organic EL display caused by light emission can be prevented. Also, an organic EL element aggregation can be formed, and the organic EL element aggregation can be divided into individual organic EL elements. Hence numerous organic EL displays can be manufactured at once, and productivity can be improved.

What is claimed is:

1. An organic EL device aggregation, comprising:
  a first translucent substrate having an upper surface and a lower surface;
  a plurality of organic EL devices, arranged on top of said first translucent substrate in matrix, and each formed by layering an anode, a photoemissive layer formed from a plurality of organic substances, and a cathode and each functioning as an individual display device; and,
  a second translucent substrate, comprising depressions, each of which corresponds to each of said plurality of organic EL devices, said second translucent substrate having an upper planar surface,
  each of said organic EL devices being sealed by said first and second translucent substrates and the distance between the lower surface of said first translucent substrate and the upper planar surface of said second translucent substrate being substantially constant across the entire surface of said first translucent substrate.

2. The organic EL device aggregation according to claim 1, wherein said first and second translucent substrates are formed from glass.

3. An organic EL device aggregation according to claim 1, wherein
  at least one end face of said first translucent substrate substantially coincides with at least one end face of said second translucent substrate in a direction perpendicular to the main surfaces of said first and second translucent substrates.

* * * * *